(12) United States Patent
Singh et al.

(10) Patent No.: US 12,249,987 B2
(45) Date of Patent: Mar. 11, 2025

(54) PROGRAMMABLE LOOK-UP TABLE SYSTEMS AND METHODS

(71) Applicant: Lattice Semiconductor Corporation, Hillsboro, OR (US)

(72) Inventors: Satwant Singh, Fremont, CA (US); Patrick Crotty, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 82 days.

(21) Appl. No.: 18/146,925

(22) Filed: Dec. 27, 2022

(65) Prior Publication Data

US 2023/0216503 A1 Jul. 6, 2023

Related U.S. Application Data

(60) Provisional application No. 63/295,747, filed on Dec. 31, 2021.

(51) Int. Cl.
*H03K 19/17728* (2020.01)
*H03K 19/17736* (2020.01)

(52) U.S. Cl.
CPC . *H03K 19/17728* (2013.01); *H03K 19/17744* (2013.01)

(58) Field of Classification Search
None
See application file for complete search history.

(56) References Cited

U.S. PATENT DOCUMENTS

| | | | |
|---|---|---|---|
| 5,920,202 A | * | 7/1999 | Young ............ H03K 19/17704 326/39 |
| 6,998,872 B1 | | 2/2006 | Chirania et al. |
| 7,061,271 B1 | | 6/2006 | Young et al. |
| 7,205,790 B1 | | 4/2007 | Young |
| 7,312,632 B2 | | 12/2007 | Lewis et al. |
| 7,330,052 B2 | | 2/2008 | Kaptanoglu et al. |
| 7,394,287 B1 | | 7/2008 | Hutton |

(Continued)

FOREIGN PATENT DOCUMENTS

CN 101969306 B 1/2013

OTHER PUBLICATIONS

Zhu et al., "Performance Evaluation of Input Sharing LUT Architectures in FPGA," Oct. 2016, pp. 710-712, IEEE, Hangzhou, China.

*Primary Examiner* — Anh Q Tran
(74) *Attorney, Agent, or Firm* — Haynes and Boone, LLP

(57) ABSTRACT

Various techniques are provided to implement look-up table (LUT) circuits. In one example, a LUT circuit includes a first LUT configured to selectively receive a first input signal and each input signal of a set of input signals and determine a first output signal based on the first input signal and/or an input signal(s) of the set. The LUT circuit also includes a second LUT configured to selectively receive a second input signal and each input signal of the set and determine a second output signal based on the second input signal and/or an input signal(s) of the set. The LUT circuit also includes a multiplexer configured to selectively receive the first and second output signals and a third input signal, and selectively provide, based on the third input signal, the first or second output signal as an output of the LUT circuit. Related systems and methods are also provided.

20 Claims, 11 Drawing Sheets

(56) References Cited

U.S. PATENT DOCUMENTS

| | | |
|---|---|---|
| 7,800,401 B1 | 9/2010 | Lewis et al. |
| 7,812,635 B1 | 10/2010 | Hutton |
| 8,217,678 B1 | 7/2012 | Lewis et al. |
| 9,584,128 B2 | 2/2017 | Fan et al. |
| 2008/0290898 A1* | 11/2008 | Hutton ............. H03K 19/17728 326/39 |
| 2020/0019375 A1* | 1/2020 | Pugh ................ H03K 19/17728 |

* cited by examiner

PROGRAMMABLE LOOK-UP TABLE SYSTEMS AND METHODS

CROSS-REFERENCE TO RELATED APPLICATION

This patent application claims the benefit of and priority to U.S. Provisional Patent Application No. 63/295,747, filed on Dec. 31, 2021 and entitled "Programmable Look-Up Table Systems and Methods," which is incorporated herein by reference in its entirety.

TECHNICAL FIELD

The present invention relates generally to programmable logic devices and, more particularly, to programmable look-up table systems and methods.

BACKGROUND

Programmable logic devices (PLDs) (e.g., field programmable gate arrays (FPGAs), complex programmable logic devices (CPLDs), field programmable systems on a chip (FPSCs), or other types of programmable devices) may be configured with various user designs to implement desired functionality. Typically, the user designs are synthesized and mapped into configurable resources, including by way of non-limiting examples programmable logic gates, look-up tables (LUTs), embedded hardware, interconnections, and/or other types of resources, available in particular PLDs. Physical placement and routing for the synthesized and mapped user designs may then be determined to generate configuration data for the particular PLDs. The generated configuration data is loaded into configuration memory of the PLDs to implement the programmable logic gates, LUTs, embedded hardware, interconnections, and/or other types of configurable resources.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
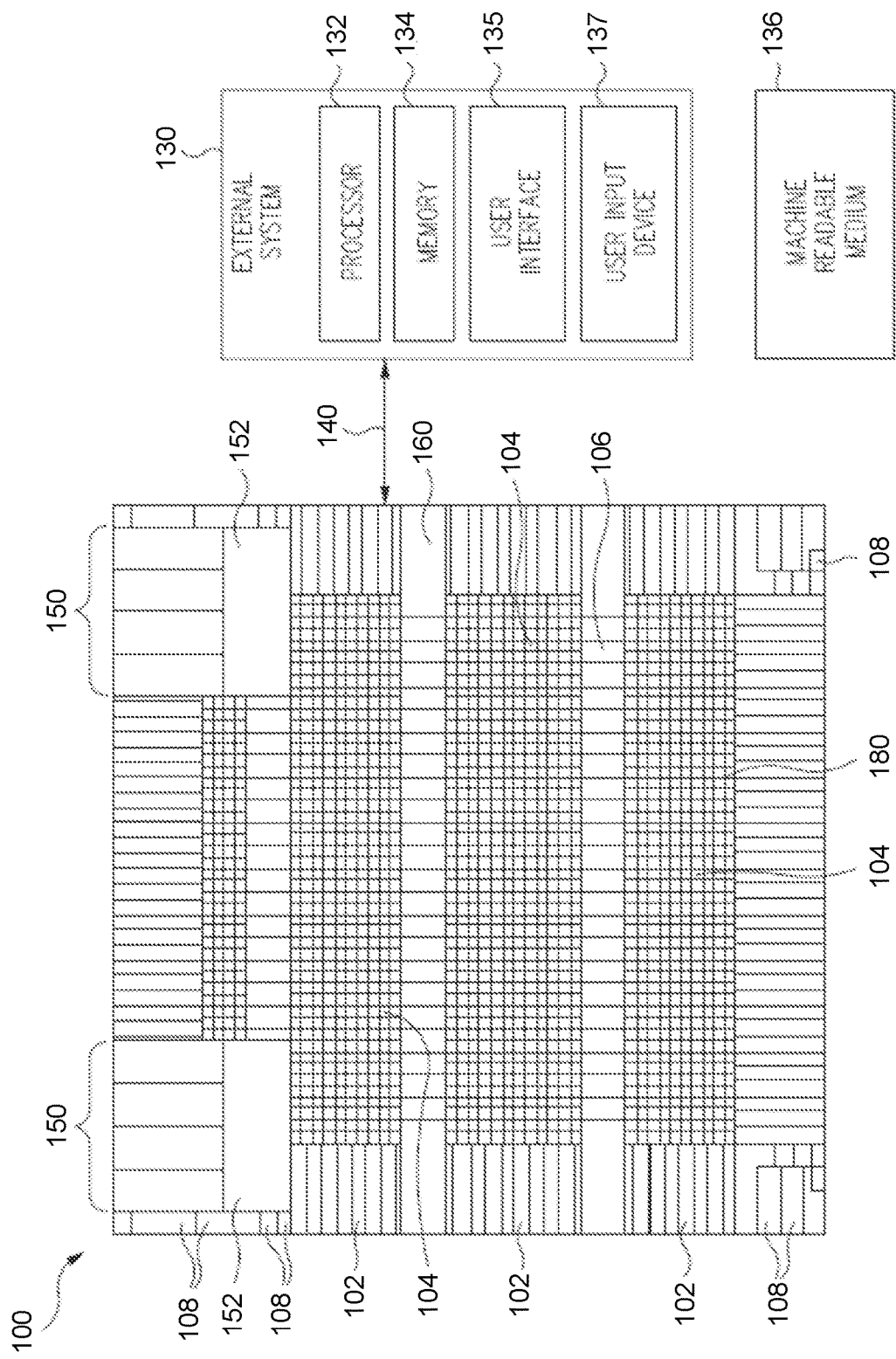
FIG. 1 illustrates a block diagram of a PLD in accordance with one or more embodiments of the disclosure.

In accordance with various embodiments set forth herein, techniques are provided to implement look-up tables (LUTs) within configurable/programmable logic components, such as components of a programmable logic device (PLD). For example, in some embodiments, a PLD includes a plurality of programmable logic blocks (PLBs), memory blocks, digital signal processing blocks, input/output blocks, and/or other components that may be interconnected in a variety of ways to implement a desired circuit design and/or functionality. A circuit design may be represented, at least in part, by a netlist, which can describe components and connections therebetween in the design. For example, a user design may be converted into and/or represented by a netlist including a set of PLD components (e.g., configured for logic, arithmetic, clocking, and/or other hardware functions) and associated interconnections available in a PLD. The netlist may be used to place components and/or route connections for the design (e.g., using routing resources of the PLD) with respect to a particular PLD (e.g., using a simulation of the desired circuit design constructed from the netlist). In general, a PLD (e.g., an FPGA) fabric includes various routing structures and an array of similarly arranged logic cells arranged within programmable function blocks (e.g., PFBs and/or PLBs). The goal in designing a particular type of PLD is generally to maximize functionality while minimizing area, power, and delay of the fabric.

One approach is to increase the functionality of the logic cells and/or PLBs. Larger LUT structures may be used as a basic function block (e.g., within a logic cell) of the fabric. LUTs having more input ports generally increases routing resources needed but allows for selectively receiving more input signals, thus offering more function flexibility and allowing more logic to be packed into each logic cell.

In various embodiments, a six-input LUT (e.g., also abbreviated as "6-LUT" or "LUTE") architecture is provided. The six-input LUT may include a first five-input LUT, a second five-input LUT, and a multiplexer selectively connected to the first five-input LUT and the second five-input LUT. The first five-input LUT may receive a set of input signals. The second five-input LUT may receive a set of input signals. The multiplexer may receive an output of the first and second five-input LUTs and provide, based on a control/select signal, the output of the first five-input LUT or the second five input LUT as an output of the six-input LUT. The six-input LUT structure may generally allow for more logic packing compared to conventional LUT structures, such as four-input LUT structures. The six-input LUT architecture according to one or more embodiments provide more functionality, capacity, and scalability while minimizing complexity, costs (e.g., chip real estate costs), and delay (e.g., by minimizing a number of multiplexers and associated routing which add complexity and delay). In some cases, six-input LUTs may be associated with a lower area-delay product than LUTs associated with other sizes (e.g., including four-input LUTs).

In some embodiments, the first five-input LUT may selectively receive input signals A, B, C, D, and EA whereas the second five-input LUT may selectively receive input signals A, B, C, D, and EB. In some aspects, a given input signal may be referred to as being selectively received by a LUT when the LUT may be configured (e.g., components and associated routing appropriately configured/programmed) to receive or not receive the input signal based on an implementation and/or a desired application/functionality of the LUT. Providing four common input signals (e.g., up to four common input signals) between the first and second five-input LUTs while having a different fifth input signal (e.g., EA for the first five-input LUT, EB for the second five-input LUT) may provide more flexibility in functionality and packing of logic into the six-input LUT architecture. In this regard, using various embodiments, a given six-input LUT may be programmed to implement functionality associated with up to six inputs. In an aspect, the six-input LUT may be programmed to implement functionality of a six-input LUT and/or one or more LUTs associated with five or fewer inputs, as further described herein. As one example, the six-input LUT may be programmed to implement two independent three-input LUTs, as further described herein.

While various embodiments are discussed herein with reference to and present improvements in the field of PLD utilization (e.g., including FPGA), various embodiments discussed herein may be implemented in other types of hardware and/or software. By way of non-limiting examples, LUT architectures/systems described herein may be implemented using application-specific integrated circuits (ASICs), system on chips, general logic circuits, processors (e.g., configurable processors, digital signal processors), generally any programmable resources of any programmable circuit or device, or any combination thereof. As an example, various embodiments may be used in custom built register transfer level (RTL) logic that can be implemented in a general integrated circuit (IC) and/or as its own type of dedicated block (e.g., as a standalone resource in a programmable fabric). Embodiments of the present design may allow for significant improvements in performance (e.g., timing performance) and space utilization, when implemented in a PLD, in RTL logic for a customized IC, and/or otherwise. As such, embodiments of the present disclosure should not be viewed as generally limited only to PLD or PLD-only implementations.

Referring now to the figures, FIG. 1 illustrates a block diagram of a PLD 100 in accordance with one or more embodiments of the disclosure. In various embodiments, the PLD 100 may be implemented as a standalone device, for example, or may be embedded within a system on a chip (SOC), other logic devices, and/or other integrated circuit (s). The PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). In some cases, the PLD 100 may generally be any type of programmable device (e.g., programmable integrated circuit) with distributed configuration, which may involve loading configuration data through pins, shifting to appropriate locations in associated fabric, and configuring configuration memory cells. The PLBs may also be referred to as logic blocks, PFUs, or PLCs. In an aspect, the PLBs 104 may collectively form an integrated circuit (IC) core or logic core of the PLD 100. The I/O blocks 102 provide I/O functionality (e.g., to support one or more I/O and/or memory interface standards) for the PLD 100, while the PLBs 104 provide logic functionality (e.g., LUT-based logic) for the PLD 100. Additional I/O functionality may be provided by serializer/deserializer (SERDES) blocks 150 and physical coding sublayer (PCS) blocks 152. The PLD 100 may also include hard intellectual property core (IP) blocks 160 to provide additional functionality (e.g., substantially predetermined functionality provided in hardware which may be configured with less programming than the PLBs 104).

The PLD 100 may include blocks of memory 106 (e.g., blocks of erasable programmable read-only memory (EEPROM), block static RAM (SRAM), and/or flash memory), clock-related circuitry 108 (e.g., clock sources, phase-locked loop (PLL) circuits, delay-locked loop (DLL) circuits, and/or feedline interconnects), and/or various routing resources 180 (e.g., interconnect and appropriate switching circuits to provide paths for routing signals throughout the PLD 100, such as for clock signals, data signals, control signals, or others) as appropriate. In general, the various elements of the PLD 100 may be used to perform their intended functions for desired applications, as would be understood by one skilled in the art.

For example, certain of the I/O blocks 102 may be used for programming the memory 106 or transferring information (e.g., various types of user data and/or control signals) to/from the PLD 100. Other of the I/O blocks 102 include a first programming port (which may represent a central processing unit (CPU) port, a peripheral data port, a serial peripheral interface (SPI) interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). In various embodiments, the I/O blocks 102 may be included to receive configuration data and commands (e.g., over one or more connections) to configure the PLD 100 for its intended use and to support serial or parallel device configuration and information transfer with the SERDES blocks 150, PCS blocks 152, hard IP blocks 160, and/or PLBs 104 as appropriate. In another example, the routing resources 180 may be used to route connections between components, such as between I/O nodes of logic blocks 104. In some embodiments, such routing resources may include programmable elements (e.g., nodes where multiple routing resources intersect) that may be used to selectively form a signal path for a particular connection between components of the PLD 100 or between the PLD 100 and an external device for transporting/communicating data (e.g., using appropriately programmed I/O blocks 102). In some embodiments, the PLD 100 may be programmed to provide lookup table functionality, with each LUT selectively receiving input signals via selectively programmed (e.g., activated) routing resources and providing one or more output signals (e.g., to a multiplexer, an output port, and/or other component downstream of the LUT) via one or more corresponding selectively programmed routing resources. In this regard, the routing resources 180 may be programmed to implement wires for communicating data between various components to implement a LUT or portion thereof.

It should be understood that the number and placement of the various elements are not limiting and may depend upon the desired application. For example, various elements may not be required for a desired application or design specification (e.g., for the type of programmable device selected). Furthermore, it should be understood that the elements are illustrated in block form for clarity and that various elements would typically be distributed throughout the PLD 100, such as in and between the PLBs 104, hard IP blocks 160, and routing resources 180 to perform their conventional functions (e.g., storing configuration data that configures the PLD 100 or providing interconnect structure within the PLD 100). For example, the routing resources 180 may be used for internal connections within each PLB 104 and/or between different PLBs 104. It should also be understood that the various embodiments disclosed herein are not limited to programmable logic devices, such as the PLD 100, and may be applied to various other types of programmable devices, as would be understood by one skilled in the art.

An external system 130 may be used to create a desired user configuration or design of the PLD 100 and generate corresponding configuration data to program (e.g., configure) the PLD 100.

For example, to configure the PLD 100, the system 130 may provide such configuration data to one or more of the I/O blocks 102, PLBs 104, SERDES blocks 150, and/or other portions of the PLD 100. In this regard, the external system 130 may include a link 140 that connects to a programming port (e.g., SPI, JTAG) of the PLD 100 to facilitate transfer of the configuration data from the external system 130 to the PLD 100. As a result, the I/O blocks 102, PLBs 104, various of the routing resources 180, and any other appropriate components of the PLD 100 may be configured to operate in accordance with user-specified applications.

In the illustrated embodiment, the system 130 is implemented as a computer system. In this regard, the system 130 includes, for example, one or more processors 132 that may be configured to execute instructions, such as software instructions, provided in one or more memories 134 and/or stored in non-transitory form in one or more non-transitory machine readable media 136 (e.g., which may be internal or external to the system 130). For example, in some embodiments, the system 130 may run PLD configuration software, such as Lattice Diamond System Planner software available from Lattice Semiconductor Corporation to permit a user to create a desired configuration and generate corresponding configuration data to program the PLD 100. In this regard, in some cases, the system 130 and/or other external/remote system may be used for factory programming or remote programming (e.g., remote updating) of one or more PLDs (e.g., through a network), such as the PLD 100.

The configuration data may alternatively or in addition be stored on the PLD 100 (e.g., stored in a memory located within the PLD 100) and/or a separate/discrete memory of a system including the PLD 100 and the separate/discrete memory (e.g., a system within which the PLD 100 is operating). In some embodiments, the memory 106 of the PLD 100 may include non-volatile memory (e.g., flash memory) utilized to store the configuration data generated and provided to the memory 106 by the external system 130. During configuration of the PLD 100, the non-volatile memory may provide the configuration data via configuration paths and associated data lines to configure the various portions (e.g., I/O blocks 102, PLBs 104, SERDES blocks 150, routing resources 180, and/or other portions) of the PLD 100. In some cases, the configuration data may be stored in non-volatile memory external to the PLD 100 (e.g., on an external hard drive such as the memories 134 in the system 130). During configuration, the configuration data may be provided (e.g., loaded) from the external non-volatile memory into the PLD 100 to configure the PLD 100.

The system 130 also includes, for example, a user interface 135 (e.g., a screen or display) to display information to a user, and one or more user input devices 137 (e.g., a keyboard, mouse, trackball, touchscreen, and/or other device) to receive user commands or design entry to prepare a desired configuration of the PLD 100. In some embodiments, user interface 135 may be adapted to display a netlist, a component placement, a connection routing, hardware description language (HDL) code, and/or other final and/or intermediary representations of a desired circuit design, for example.

Figure 2:
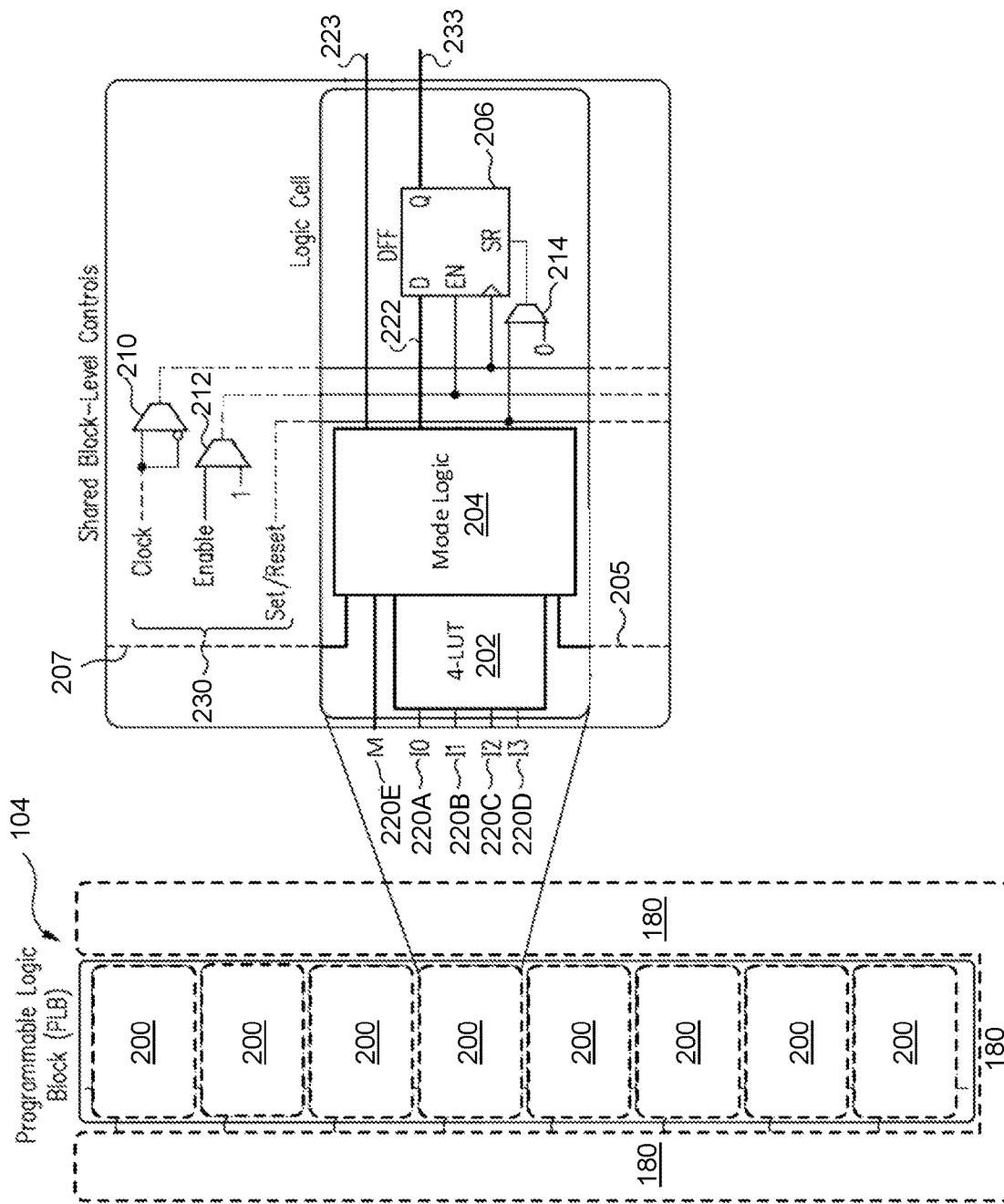
FIG. 2 illustrates a block diagram of a logic block of a PLD in accordance with one or more embodiments of the disclosure.

FIG. 2 illustrates a block diagram of a logic block 104 of the PLD 100 in accordance with one or more embodiments of the disclosure. As discussed, the PLD 100 includes a plurality of logic blocks 104 including various components to provide logic and arithmetic functionality. In the example embodiment shown in FIG. 2, the logic block 104 includes a plurality of logic cells 200, which may be interconnected internally within logic block 104 and/or externally using the routing resources 180. For example, each logic cell 200 may include various components such as: a LUT 202, a mode logic circuit 204, a register 206 (e.g., a flip-flop or latch), and various programmable multiplexers (e.g., programmable multiplexers 212 and 214) for selecting desired signal paths for the logic cell 200 and/or between logic cells 200. In this example, the LUT 202 accepts four inputs 220A-220D, which makes it a four-input LUT (which may be abbreviated as "4-LUT" or "LUT4") that can be programmed by configuration data for the PLD 100 to implement any appropriate logic operation having four inputs or less. The mode logic 204 may include various logic elements and/or additional inputs, such as an input 220E, to support the functionality of various modes for the logic cell 200 (e.g., including various processing and/or functionality modes). The LUT 202 in other examples may be of any other suitable size having any other suitable number of inputs for a particular implementation of a PLD. In some embodiments, different size LUTs may be provided for different logic blocks 104 and/or different logic cells 200.

An output signal 222 from the LUT 202 and/or the mode logic 204 may in some embodiments be passed through the register 206 to provide an output signal 233 of the logic cell 200. In various embodiments, an output signal 223 from the LUT 202 and/or the mode logic 204 may be passed to the output 223 directly, as shown. Depending on the configuration of multiplexers 210-214 and/or the mode logic 204, the output signal 222 may be temporarily stored (e.g., latched) in the register 206 according to control signals 230. In some embodiments, configuration data for the PLD 100 may configure the output 223 and/or 233 of the logic cell 200 to be provided as one or more inputs of another logic cell 200 (e.g., in another logic block or the same logic block) in a staged or cascaded arrangement (e.g., including multiple levels) to configure logic and/or other operations that cannot be implemented in a single logic cell 200 (e.g., operations that have too many inputs to be implemented by a single LUT 202). Moreover, logic cells 200 may be implemented with multiple outputs and/or interconnections to facilitate selectable modes of operation.

The mode logic circuit 204 may be utilized for some configurations of the PLD 100 to efficiently implement arithmetic operations such as adders, subtractors, comparators, counters, or other operations, to efficiently form some extended logic operations (e.g., higher order LUTs, working on multiple bit data), to efficiently implement a relatively small RAM, and/or to allow for selection between logic, arithmetic, extended logic, and/or other selectable modes of operation. In this regard, the mode logic circuits 204, across multiple logic cells 202, may be chained together to pass carry-in signals 205 and carry-out signals 207, and/or other signals (e.g., output signals 222) between adjacent logic cells 202. In the example of FIG. 2, the carry-in signal 205 may be passed directly to the mode logic circuit 204, for example, or may be passed to the mode logic circuit 204 by configuring one or more programmable multiplexers. In some cases, the mode logic circuits 204 may be chained across multiple logic blocks 104.

The logic cell 200 illustrated in FIG. 2 is merely an example, and logic cells 200 according to different embodiments may include different combinations and arrangements of PLD components.

In some embodiments, the LUT 202 may be a six-input LUT rather than a four-input LUT as shown in FIG. 2, such that each logic block 104 uses a six-input block as a basic building block. Also, although FIG. 2 illustrates a logic block 104 having eight logic cells 200, a logic block 104 according to other embodiments may include fewer logic cells 200 or more logic cells 200. In some cases, the logic blocks 104 may be interconnected to form one or more logic clusters, with each logic block 104 forming a basic logic element (BLE) of a logic cluster. Each of the logic cells 200 of a logic block 104 may be used to implement a portion of a user design implemented by the PLD 100. In this regard, the PLD 100 may include many logic blocks 104, each of which may include logic cells 200 and/or other components which are used to collectively implement the user design.

Figure 3:
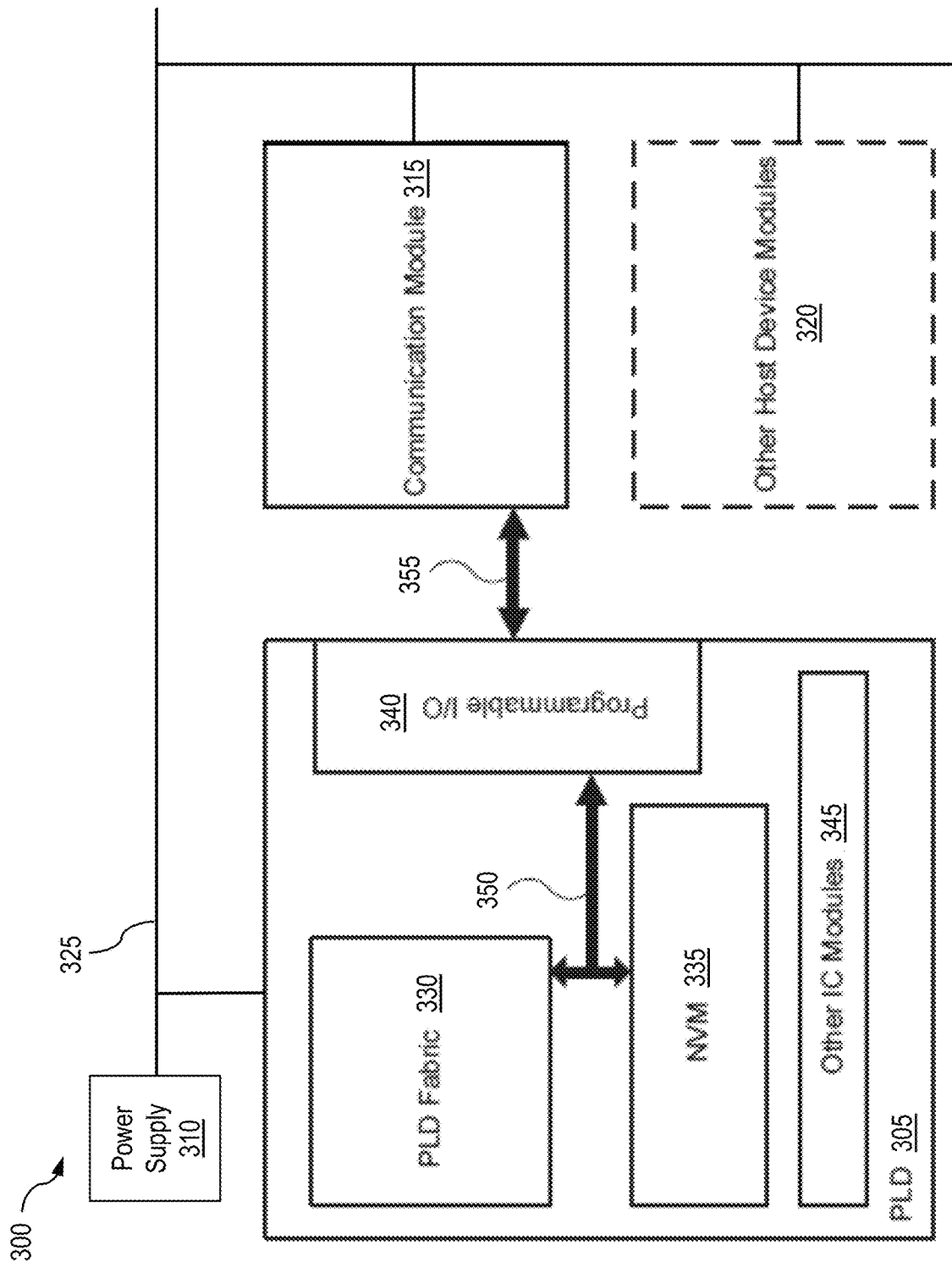
FIG. 3 illustrates a block diagram of a device including a PLD in accordance with one or more embodiments of the disclosure.

FIG. 3 illustrates a block diagram of a device 300 including a PLD 305 in accordance with one or more embodiments of the disclosure. The device 300 includes a power supply 310 and one or more components facilitating operation of the device 300, such as the PLD 305, a communication module 315, and other device modules 320 to facilitate management of the PLD 305, for example, or to facilitate device application. In various embodiments, the device 300 may be implemented as a smart phone, a laptop computer, a tablet computer, a desktop computer, a smart environmental sensor, a home automation device (e.g., sensor and/or actuator), a network management device, a smart display or television, an automobile user interface, and/or other device. More generally, the device 300 may be implemented as an embedded device or any other computing or electronic device integrable with the PLD 305.

As shown in FIG. 3, the power supply 310 may provide one or more supply voltages to various components of the device 300 over power buses 325. For example, the power supply 310 may be implemented as a battery or battery bank, for example, with integrated charging and monitoring electronics. In other embodiments, the power supply 310 may receive grid or other external power and include various power conditioning, regulating, and/or conversion components to provide the appropriate operating voltage for each component of the device 300 using one or more of the power buses 325. The power buses 325 may include one or more conductive wires and/or traces to convey such supply voltages to the various components, as shown, and may in some embodiments include signaling traces to transmit and receive logic signals/data facilitating operation of the power supply 310 and/or various components of the device 300.

The PLD 305 may be implemented by components similar to those described with respect to the PLD 100 of FIG. 1, but with additional configurable and/or hard IP elements configured to facilitate operation and/or communication with the PLD 305 within a particular computing application and/or architecture. As shown in the embodiment illustrated in FIG. 3, the PLD 305 may include a PLD fabric 330 linked by various buses to a non-volatile memory (NVM) 335, a programmable I/O 340, and/or other integrated circuit (IC) modules 345, which may all be implemented on a monolithic IC. In general, the PLD fabric 330 may be implemented by any of the various components described with respect to the PLD 305 and may be configured using a design process similar to a design process 900 described in relation to FIG. 9 to generate and program the PLD fabric 330 according to a desired configuration. In some cases, the PLD 305 may be configured to use various hard IP elements identified in FIG. 3 to receive, decrypt, authenticate, and/or verify a received configuration prior to programming the PLD fabric 330 according to the received configuration, for example, or to otherwise communicate with a management system for the PLD 305.

The NVM 335 may be implemented as a hard IP resource configured to provide securable non-volatile storage of data used to facilitate operation of the PLD 305. The NVM 335 may include multiple differentiated sectors, such as one or more configuration image sectors, a device key sector (e.g., an AES key sector and a separate public key/key pair sector), a UFM sector, and/or other defined storage sectors. Configuration image sectors may each store a configuration for the PLD fabric 330, for example, so as to allow them to be selected (e.g., based on version or date) and used to program the PLD fabric 330. A trim sector may be used to store manufacturer trim, device identifier, device category identifier, and/or other data specific to the PLD 305, for example, such as a modifiable customer-specific ordering part number and/or a generated customer ID number. Device key sectors may be used to store encryption/decryption keys, public/private keys, and/or other security keys specific to the PLD 305. UFM sectors may be used to store user data generally accessible by the PLD fabric 330, such as configurations or application-specific security keys, certificates, and/or other secure(d) user data. Any one or more individual elements, portions, or sectors of the NVM 335 may be implemented as configurable memory.

The programmable I/O 340 may be implemented as at least partially configurable resources and/or hard IP resources configured to provide or support a communications link between the PLD fabric 330 and an external controller, memory, and/or other device, such as the communication module 315, for example, across a bus 350 (e.g., an internal and/or integrated communications bus configured to link portions of the PLD fabric 330 to the programmable I/O 340, the NVM 335, and/or other elements of the PLD 305) and according to one or more external bus interfaces and/or protocols 355. The programmable I/O 340 may also be configured to support communications between the PLD fabric 330 and/or the NVM 335 across the bus 350 and/or external bus interface/protocol 355 with the communication module 315 and/or other components of the device 300, for example, in addition or as an alternative to external system 130/machine readable medium 136, as described herein. In some embodiments, the bus 350 and/or the programmable I/O 340 may be integrated with the PLD fabric 330. More generally, one or more components of the PLD 305 shown as separate in FIG. 3 may be integrated with and/or within each other.

The other IC modules 345 may be implemented as hard and/or configurable IP resources configured to facilitate operation of the PLD 305. For example, the other IC modules 345 may include a security engine implemented as a hard IP resource configured to provide various security functions for use by the PLD fabric 330 and/or the device 300. The other IC modules 345 may also include a configuration engine implemented as a hard IP resource configured to manage the configurations of and/or communications amongst the various components of the PLD 305, including to manage or control configurations of components of the PLD 305, boot of the PLD fabric 330, and flow control throughout the PLD 305. In some embodiments, the other IC modules 345 may include one or more communication modules (e.g., similar to the communication module 315 of the device 300) that are integrated with the PLD 305 and that can perform various operations or subsets of operations to form and/or manage communications links over wired and/or wireless networks.

In further embodiments, the other IC modules 345 may include one or more additional external access busses implemented according to one or more of a JTAG, I2C, SPI, and/or other external access bus or protocol, for example, configured to provide access to and/or from the communication module 315 and/or other device modules 320. For example, although shown in FIG. 3 as integrated as a hard IP resource within the PLD 305, NVM 335, or a similar additional hard IP resource may be integrated with the device 300 (e.g., as other device modules 320) and accessible (e.g., by the PLD fabric 330 and/or other elements of the PLD 305) over the internal bus 350, external bus interface/protocol 355, and/or any one or combination of such external access buses or protocols.

The communication module 315 may be implemented as a network communications IC configured to form communications links to a remote external device (e.g., over one or more wired and/or wireless networks) used to manage operation of the PLD 305. For example, in some embodiments, the communication module 315 may be implemented as a wireless communication module configured to support a wireless communications link (e.g., formed according to WiFi, Bluetooth, Zigbee, Zwave, near-field communication (NFC), cellular, and/or other open and/or proprietary wireless communication protocols) to a communications network. In such embodiments, the communication module 315 may be configured to manage various security features of such wireless communications link (e.g., establishing communications link credentials, employing communications link credentials to establish a wireless communications link, negotiating encryption keys for encrypted communications tunnels established over such wireless communications link, such as transport layer security (TLS)), for example, and/or may be configured to be controlled by the PLD 305 and/or other device modules 320 to manage such security features. The PLD 305 may be configured to take control of operation of the communication module 315, superseding control otherwise by the device 300, over external bus interface/protocol 355 and/or other external bus interface/protocol implemented by the PLD 305 and/or the device 300.

The other device modules 320 may include various computing, sensor, and/or actuator elements configured to implement a device application, for example, such as a remote sensor application, a remote controller application, and/or a remote computing application. The other host modules 320 may also include various other communication buses, power storage and delivery elements, user interfaces (e.g., buttons, keyboard, mouse, track pad, and/or displays/touch screen displays) to support such host device applications.

Figure 4:
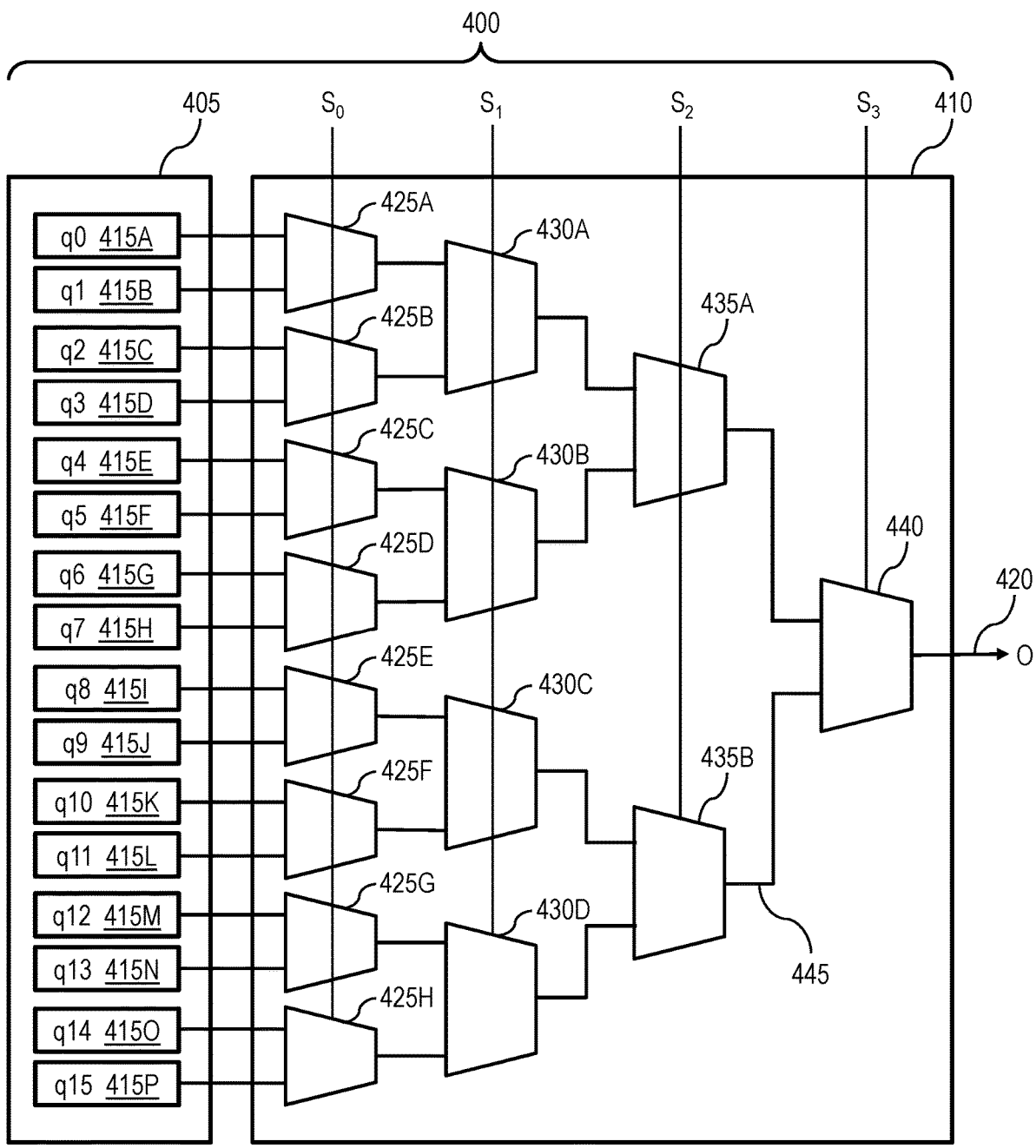
FIG. 4 illustrates an example four-input LUT in accordance with one or more embodiments of the disclosure.

FIG. 4 illustrates an example four-input LUT 400 in accordance with one or more embodiments of the disclosure. In an embodiment, the four-input LUT 400 may be, may include, or may be a part of, the LUT 202 of FIG. 2. The LUT 400 includes LUT memory 405 and an associated decoder 410. The LUT memory 410 includes memory cells 415A-P (i.e., 16 memory cells). The decoder 410 receives four select signals $S_0$, $S_1$, $S_2$, and $S_3$ (e.g., from a select logic circuit that is a part of the LUT 400 or coupled to the LUT 400) and provides a data bit value stored in one of the memory cells 415A-P (e.g., one of data bit values $q_0$ through $q_{15}$) as an output signal O on an output line 420 of the decoder 410.

The decoder 410 includes multiplexers 425A-H (e.g., 2:1 multiplexers), 430A-D, 435A-B, and 440 interconnected by interconnections. For example, the multiplexers 435B and 440 are interconnected by an interconnection 445. Each of the multiplexers 425A-H selects one of its two inputs based on the input $S_0$. For example, the multiplexer 425B coupled to memory cells 415C and 415D receives as its input data bit values $q_2$ and $q_3$ stored in the memory cells 415C and 415D, and may, dependent on application (e.g., logic to be implemented), provide as its output the data bit value $q_2$ stored in the memory cell 415C when the input $S_0$ is 0 and the data bit value $q_3$ stored in the memory cell 415D when the input $S_0$ is 1. Similarly, the multiplexers 430A-D provide their respective outputs based on the input $S_1$, the multiplexers 435A-B provide their respectively outputs based on the input $S_2$, and the multiplexer 440 provides its output based on the input $S_3$. The output of the multiplexer 440 is provided as the output signal O of the decoder 410. In this regard, the inputs $S_0$, $S_1$, $S_2$, and $S_3$ are utilized to read one of the memory cells 415A-P and may be referred to as selector inputs, selector signals, control inputs, or control signals.

Figure 5:
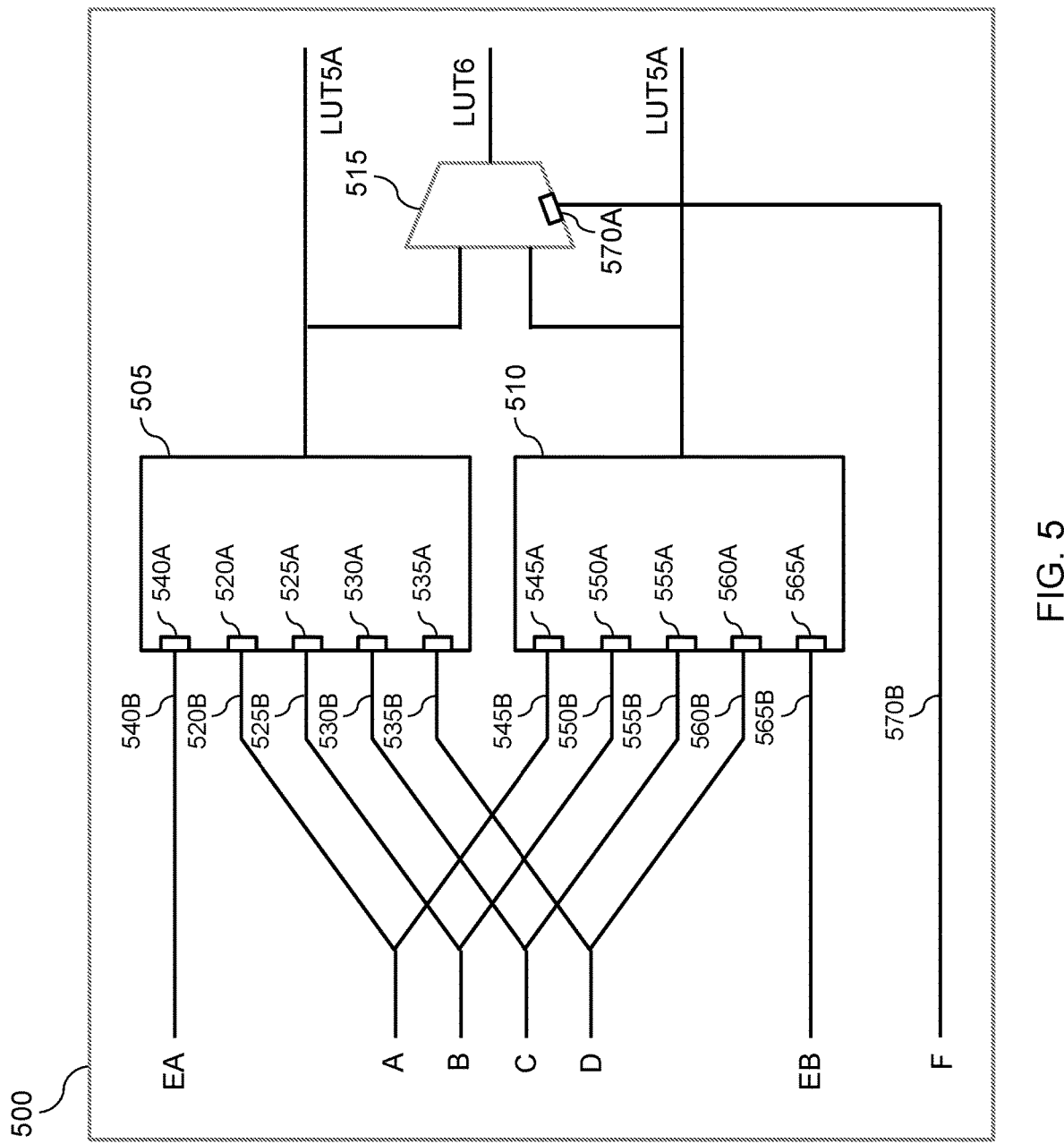
FIG. 5 illustrates an example six-input LUT architecture in accordance with one or more embodiments of the disclosure.

FIG. 5 illustrates a LUT 500 in accordance with one or more embodiments of the disclosure. The LUT 500 includes five-input LUTs 505 and 510 and a multiplexer 515. The LUT 505 selectively receives signals A, B, C, D, and EA as its inputs at input ports 520A, 525A, 530A, 535A, and 540A, respectively, via programmable input/routing lines 520B, 525B, 530B, 535B, and 540B, respectively, and provides a signal LUT5A as its output based on the input signals A, B, C, D, and EA. The LUT 510 selectively receives signals A, B, C, D, and EB as its inputs at input ports 545A, 550A, 555A, 560A, and 565A, respectively, via programmable input/routing lines 545B, 550B, 555B, 560B, and 565B, respectively, and provides a signal LUT5B as its output based on the input signals A, B, C, D, and EB. In some cases, the input signals A, B, C, D, and EA may be considered select/control signals of the LUT 505 for selecting, as the output signal LUT5A of the LUT 505, a data bit value from one of thirty-two memory cells of a LUT memory of the LUT 505, and, similarly, the input signals A, B, C, D, and EB may be considered select/control signals of the LUT 510 for selecting, as the output signal LUT5B of the LUT 510, a data bit value from one of thirty-two memory cells of a LUT memory of the LUT 510.

The multiplexer 515 selectively receives, as its inputs, the signals LUT5A and LUT5B from the LUTs 505 and 510, respectively, and a signal F (e.g., also referred to as a select signal or a control signal) at an input port 570A via a programmable input/routing line 570B. In some cases, the multiplexer 515 may be implemented as a 2:1 multiplexer to provide a signal LUT6 as its output based on the signals LUT5A, LUT5B, and F. As a non-limiting example, the output signal LUT6 may be the output signal LUT5A when the signal F is a logic low and the output signal LUT5B when the signal F is a logic high, or vice versa. In this regard, the input signals A, B, C, D, EA, EB, and F may be considered select signals of the LUT 500 for selecting, as the output signal LUT6 of the LUT 500, a data bit value from one of sixty-four memory cells of a LUT memory collectively provided by the LUTs 505 and 510. It is noted that the signals LUT5A, LUT5B, and LUT6 may each be considered an output of the LUT 500. In some cases, the LUT 500 may be implemented (e.g., with routing resources appropriately programmed and not programmed) to provide a single output signal (e.g., rather than three output signals LUT5A, LUT5B, and LUT6 as shown in FIG. 5).

Each of the LUT 505, the LUT 510, the multiplexer 515, and associated routing to and/or between the LUT 505, the LUT 510, and the multiplexer 515 may be selectively programmed (e.g., selectively enabled or disabled) depending on an application to be implemented by the LUT 500. As one non-limiting example, the programmable input lines 520B and 545B are both programmed (e.g., enabled) to provide/route the input A to the input port 520A of the LUT 505 and the input port 545A of the LUT 510, respectively, the programmable input line 525B is programmed to provide the input B to the input port 525A of the LUT 505, and the programmable input line 550B is not programmed (e.g., not enabled) such that the input B is not provided to the LUT 510. Other combinations by which to selectively program any given routing resource (e.g., programmable line/interconnection) may be utilized dependent on the application (e.g., logic/functionality) to be implemented by the LUT 500. As such, programmability of the LUT 505, the LUT 510, the multiplexer 515, and associated routing to and/or between the LUT 505, the LUT 510, and the multiplexer 515 allows for selectively programming the LUT 500 as a six-input LUT and/or a LUT associated with fewer than six inputs as needed for a desired application(s).

In some embodiments, by the LUTs 505 and 510 having shared inputs (e.g., four shared A, B, C, and D in the example of FIG. 5) and at least one different input (e.g., EA for the LUT 505 and EB for the LUT 510), the LUT 500 provides flexibility in logic packed into the LUT 505 and LUT 510 while minimizing delay (e.g., by using as few multiplexers as needed). In this regard, the inputs EA and EB may be, but need not be, independent of each other. Further in this regard, providing the interconnections 540B and 565B for providing the signals EA and EB, respectively, as individually programmable interconnections provide more flexibility in functionality and packing. In this regard, the interconnections 540B and 565B are interconnections that may be separately/independently programmed. Such flexibility may facilitate implementation of the LUT 500 as one or more LUTs associated with six or fewer inputs. As an example, to implement a four-input LUT or smaller LUT using the LUT 505, a subset of the inputs A, B, C, D, and EA may be packed into the LUT 505. Similarly, to implement a four-input LUT or smaller LUT using the LUT 510, a subset of the inputs A, B, C, D, and EB may be packed into the LUT 510.

Figure 6A:
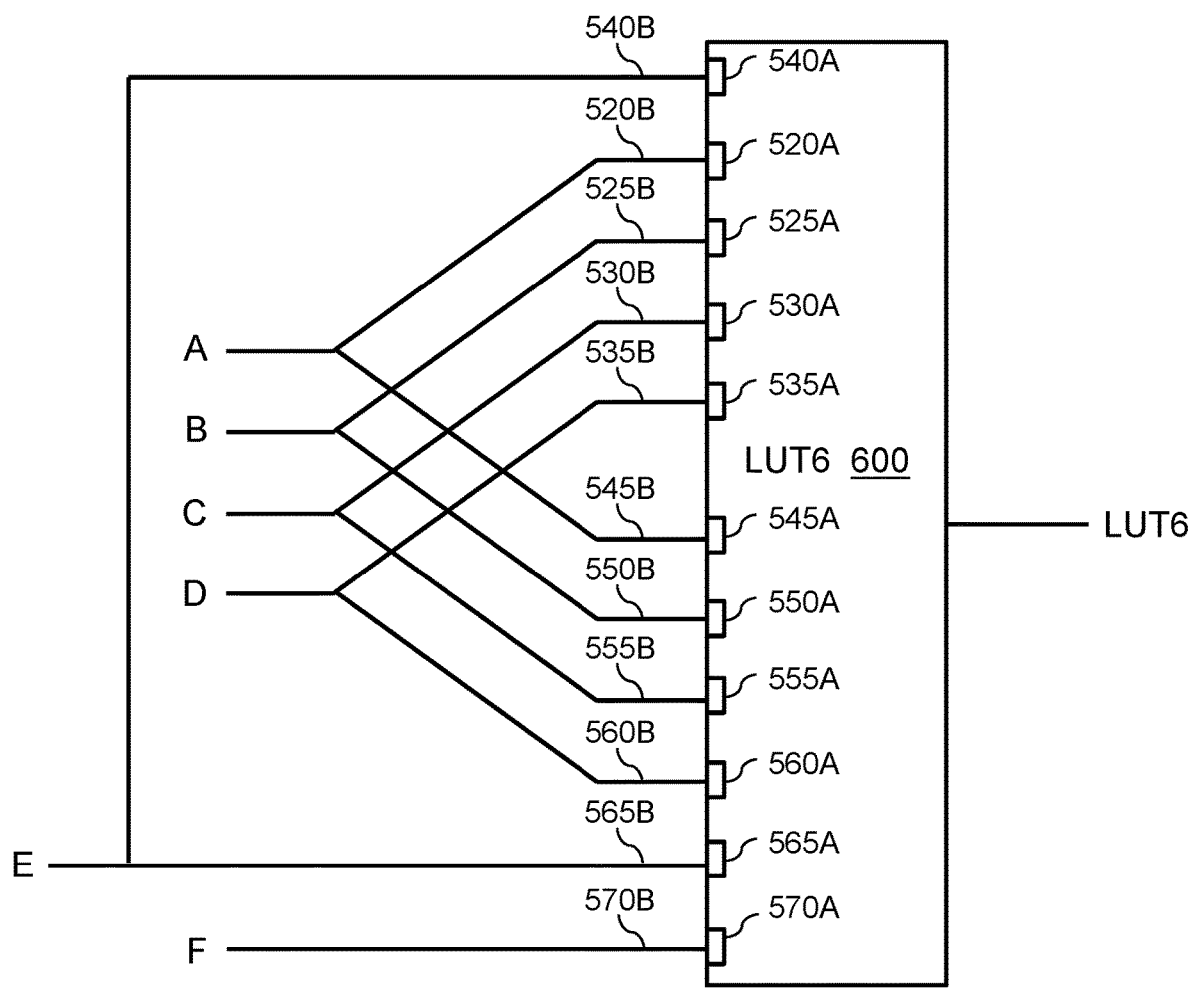
FIGS. 6A, 6B, and 6C each illustrates an example manner of packing logic in the LUT of FIG. 5 in accordance with one or more embodiments.
Figure 6B:
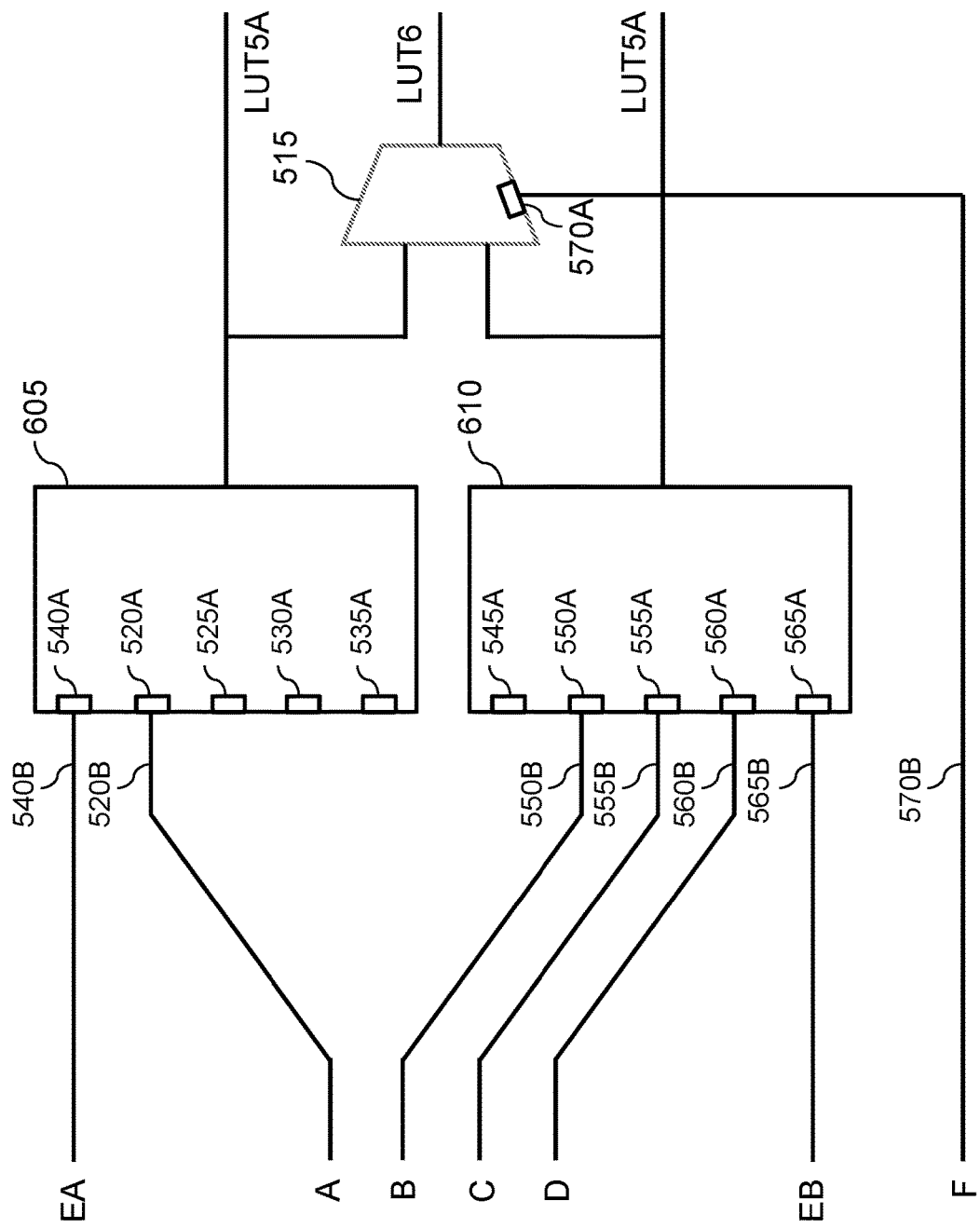
Figure 6C:
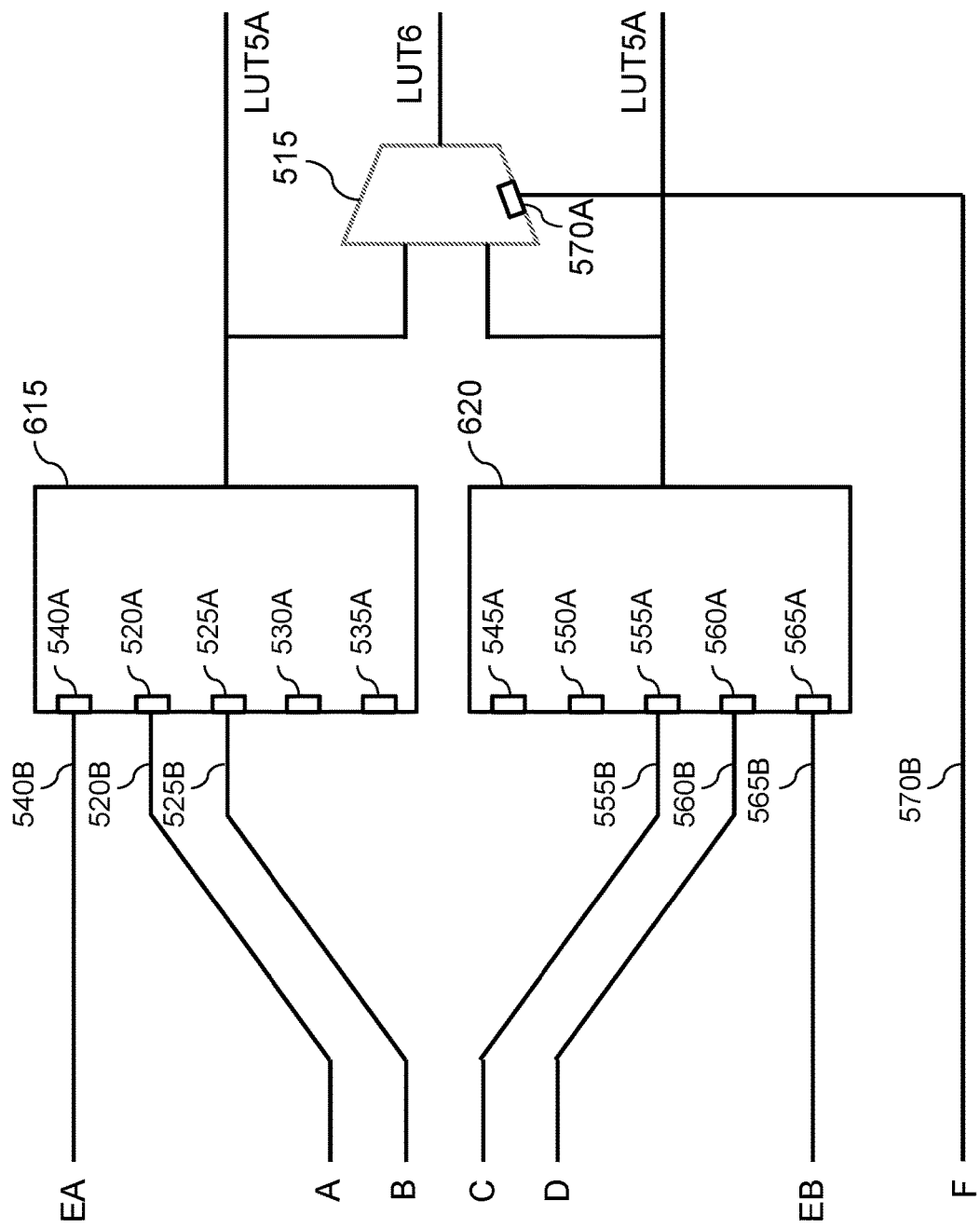

As non-limiting examples, FIGS. 6A, 6B, and 6C illustrate example manners of packing logic into the LUTs 505 and 510 of FIG. 5 in accordance with one or more embodiments. After the LUT 500 is configured/programmed (e.g., using configuration data from the external system 130), the LUT 500 may implement functionality according to such logic packing. Other manners by which to pack logic into the LUTs 505 and 510 may be implemented dependent on application.

In FIG. 6A, the LUTs 505 and 510 and the multiplexer 515 may be programmed to implement a single six-input LUT 600 (e.g., without the five-input LUT outputs LUT5A and LUT5B of FIG. 5). The LUT 600 receives the input A at the input ports 520A and 545A via the input lines 520B and 545B, respectively; the input B at the input ports 525A and 550A via the input lines 525B and 550B, respectively; the input C at the input ports 530A and 555A via the input lines 530B and 555B, respectively; the input D at the input ports 535A and 560A via the input lines 535B and 560B, respectively; the input E at the input ports 540A and 565A via the input lines 540B and 565B, respectively, where E=EA=EB; and input F at the input port 570A via the input line 570B. In this regard, since E=EA=EB, the outputs LUT6=LUT5A=LUT5B of the LUT 500 (e.g., collapses into a single 6-input LUT output).

In FIG. 6B, the LUT 505 may be used to implement a two-input LUT 605 and the LUT 510 may be used to implement a four-input LUT 610. In this regard, two inputs A and EA are packed into the LUT 505 to implement the two-input LUT 605, and four inputs B, C, D, and EB are packed into the LUT 510 to implement the four-input LUT 610. To implement the two-input LUT 605, the programmable input lines 520B and 540B are programmed to provide the inputs A and EA to the input ports 520A and 540A, respectively, of the LUT 505 whereas the programmable input lines 525B, 530B, and 535B are not programmed such that the inputs B, C, and D, respectively, are not provided to the LUT 505. To implement the four-input LUT 610, the programmable input lines 550B, 555B, 560B, and 565B are programmed to provide the inputs B, C, D, and EB to the input ports 550A, 555A, 560A, and 565A, respectively, of the LUT 510 whereas the line 545B is not programmed such that the input A is not provided to the LUT 510. In this example, the two-input LUT 605 and the four-input LUT 610 have no inputs in common and may be referred to as being independent from each other. Whether the multiplexer 515 is used (e.g., activated, turned on) to receive the outputs LUT5A and LUT5B and provide the output LUT6 based on the outputs LUT5A and LUT5B is dependent on application. When the multiplexer 515 is used, the programmable input line 570B may be programmed to provide the signal F to the input port 570A of the multiplexer 515. When the multiplexer 515 is not used, the programmable input line 570B may be unprogrammed.

In FIG. 6C, the LUT 505 may be used to implement a three-input LUT 615 and the LUT 510 may be used to implement a three-input LUT 620. In this regard, three inputs A, B, and EA are packed into the LUT 505 to implement the three-input LUT 615, and three inputs C, D, and EB are packed into the LUT 510 to implement the three-input LUT 620. To implement the three-input LUT 615, the programmable input lines 520B, 525B, and 540B are programmed to provide the inputs A, B, and EA to the input ports 520A, 525A, and 540A, respectively, of the LUT 505 whereas the programmable input lines 530B and 535B are not programmed such that the inputs C and D, respectively, are not provided to the LUT 505. To implement the three-input LUT 620, the programmable input lines 555B, 560B, and 565B are programmed to provide the inputs C, D, and EB to the input ports 555A, 560A, and 565A, respectively, of the LUT 510 whereas the programmable input lines 545B and 550B are not programmed such that the inputs A and B are not provided to the LUT 510. The three-input LUTs 615 and 620 have no inputs in common and may be referred to as being independent three-input LUTs. Whether the multiplexer 515 is used (e.g., activated, turned on) to receive the outputs LUT5A and LUT5B and provide the output LUT6 based on the outputs LUT5A and LUT5B is dependent on application. When the multiplexer 515 is used, the programmable input line 570B may be programmed to provide the signal F to the input port 570A of the multiplexer 515. When the multiplexer 515 is not used, the programmable input line 570B may be unprogrammed.

Figure 7:
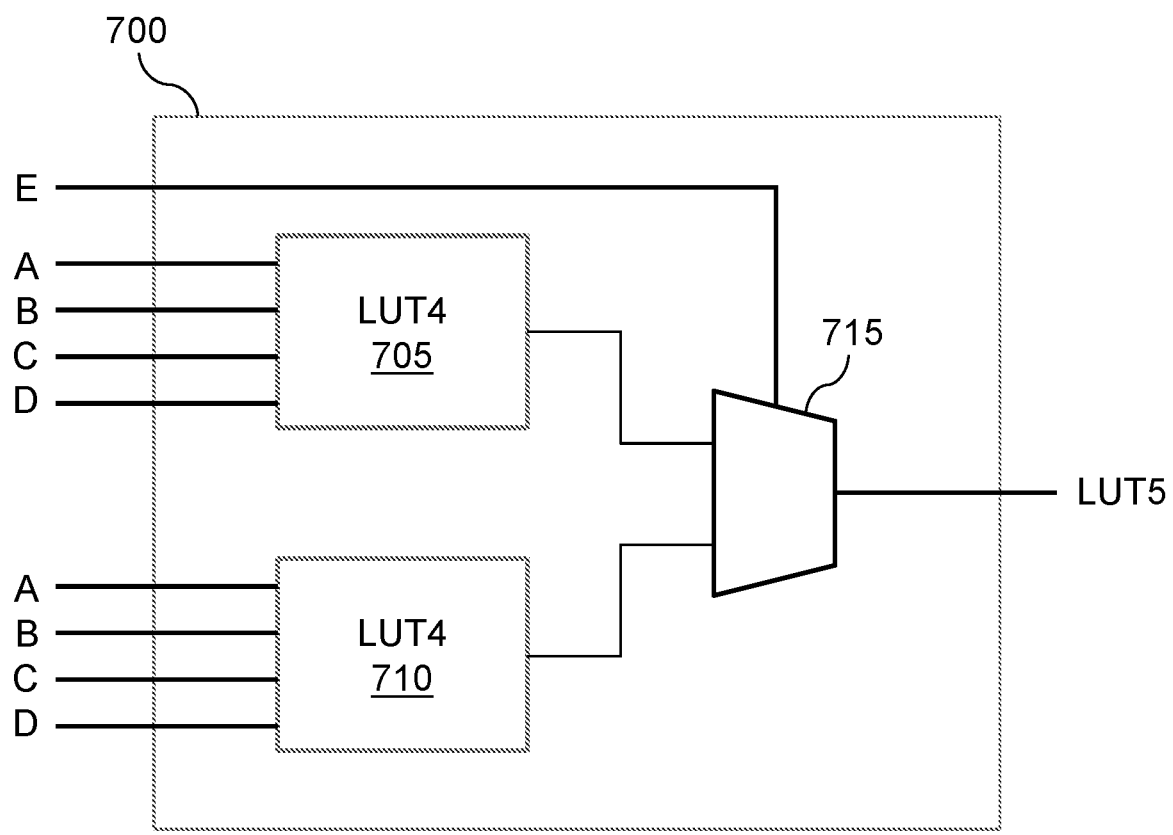
FIG. 7 illustrates an example five-input LUT in accordance with one or more embodiments of the disclosure.

FIG. 7 illustrates an example five-input LUT 700 in accordance with one or more embodiments of the disclosure.

The LUT 700 includes four-input LUTs 705 and 710 and a multiplexer 715. The LUT 705 and LUT 710 each selectively receive signals A, B, C, and D as its inputs and provide an output based on the signals A, B, C, and D selectively received by the LUT 705 and LUT 710. In an embodiment, the LUT 705 and/or LUT 710 may be implemented according to the four-input LUT 400 of FIG. 4. The multiplexer 715 receives a signal E. The multiplexer 715 may be implemented as a 2:1 multiplexer to provide/select, based on a select signal E, an output of the LUT 705 or the LUT 710 as an output signal LUT5 of the LUT 700. As a non-limiting example, the output signal LUT5 may be the output of the LUT 705 when the signal E is a logic low and the output of the LUT 710 when the signal E is a logic high, or vice versa. In an embodiment, the LUT 505 and/or 510 of FIG. 5 may be implemented according to the five-input LUT 700. As examples, when the LUT 505 is implemented according to the five-input LUT 700, the signals A, B, C, D, and E of the LUT 700 may correspond to the signals A, B, C, D, and EA, respectively, of the LUT 505, and/or when the LUT 510 is implemented according to the five-input LUT 700, the signals A, B, C, D, and E of the LUT 700 may correspond to the signals A, B, C, D, and EB, respectively, of the LUT 510.

Figure 8:
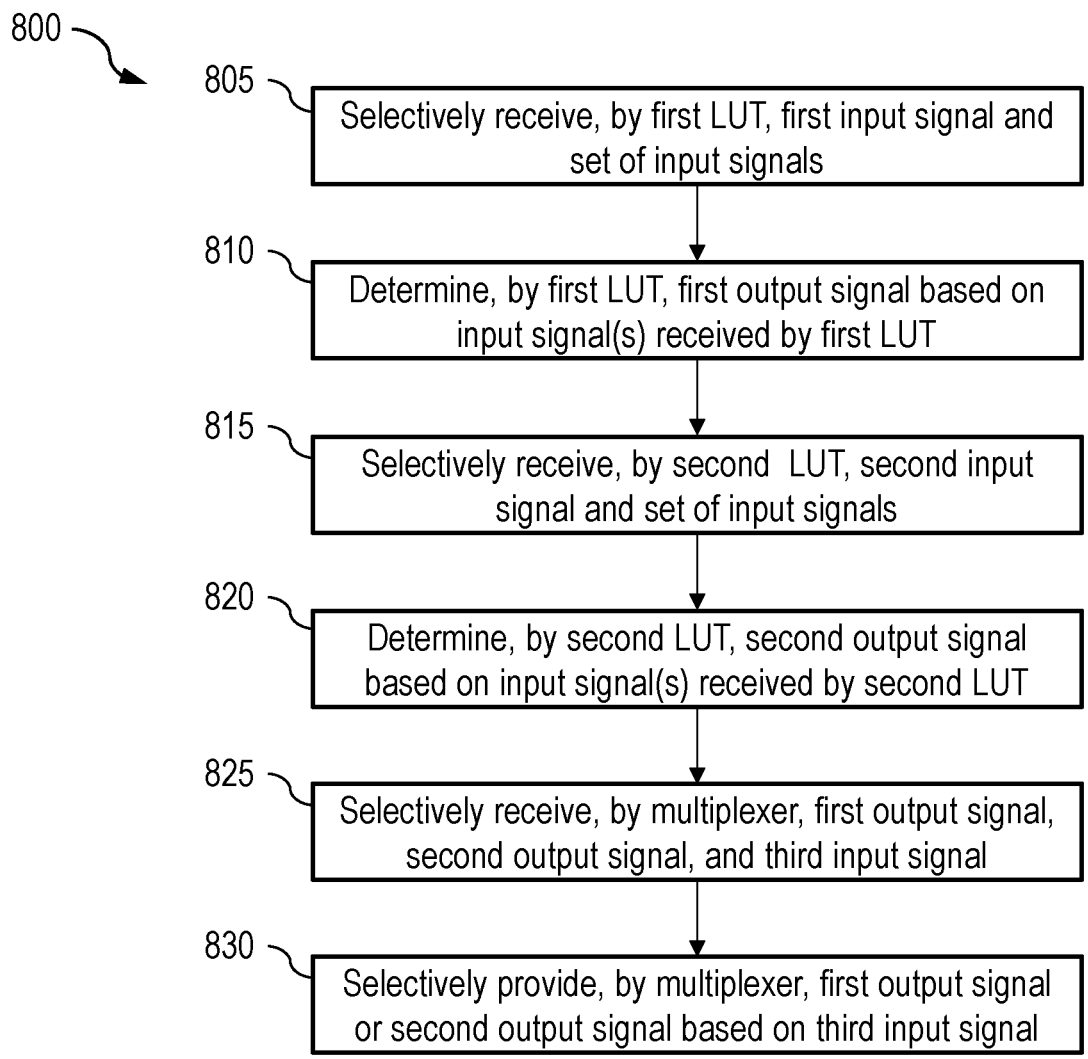
FIG. 8 illustrates a flow diagram of an example process for operating a LUT in accordance with one or more embodiments of the disclosure.

FIG. 8 illustrates a flow diagram of an example process 800 for operating a LUT in accordance with one or more embodiments of the disclosure. For explanatory purposes, the example process 800 is described herein with reference to the LUT 500 of FIG. 5, although the example process 800 may be utilized with other LUT circuits. Note that one or more operations may be combined, omitted, and/or performed in a different order as desired.

At block 805, the LUT 505 selectively receives the set of input signals A, B, C, and D and the input signal EA at the input ports 520A, 525A, 530A, 535A, and 540A, respectively, via the programmable input lines 520B, 525B, 530B, 535B, and 540B, respectively. At block 810, the LUT 505 determines the output signal LUT5A based on the set of input signals A, B, C, and D and the input signal EA.

At block 815, the LUT 510 selectively receives the set of input signals A, B, C, and D and the input signal EB at the input ports 545A, 550A, 555A, 560A, and 565A, respectively, via the programmable input lines 545B, 550B, 555B, 560B, and 565B, respectively. At block 820, the LUT 510 determines the output signal LUT5B based on the set of input signals A, B, C, and D and the input signal EB.

At block 825, the multiplexer 515 selectively receives the first output signal LUT5A from the LUT 505, the second output signal LUT5B from the LUT 510, and the input signal F at the input port 570A via the programmable input line 570B. At block 830, the multiplexer 515 selectively provides the first output signal LUT5A or the second output signal LUT5B as an output of the LUT 500.

Figure 9:
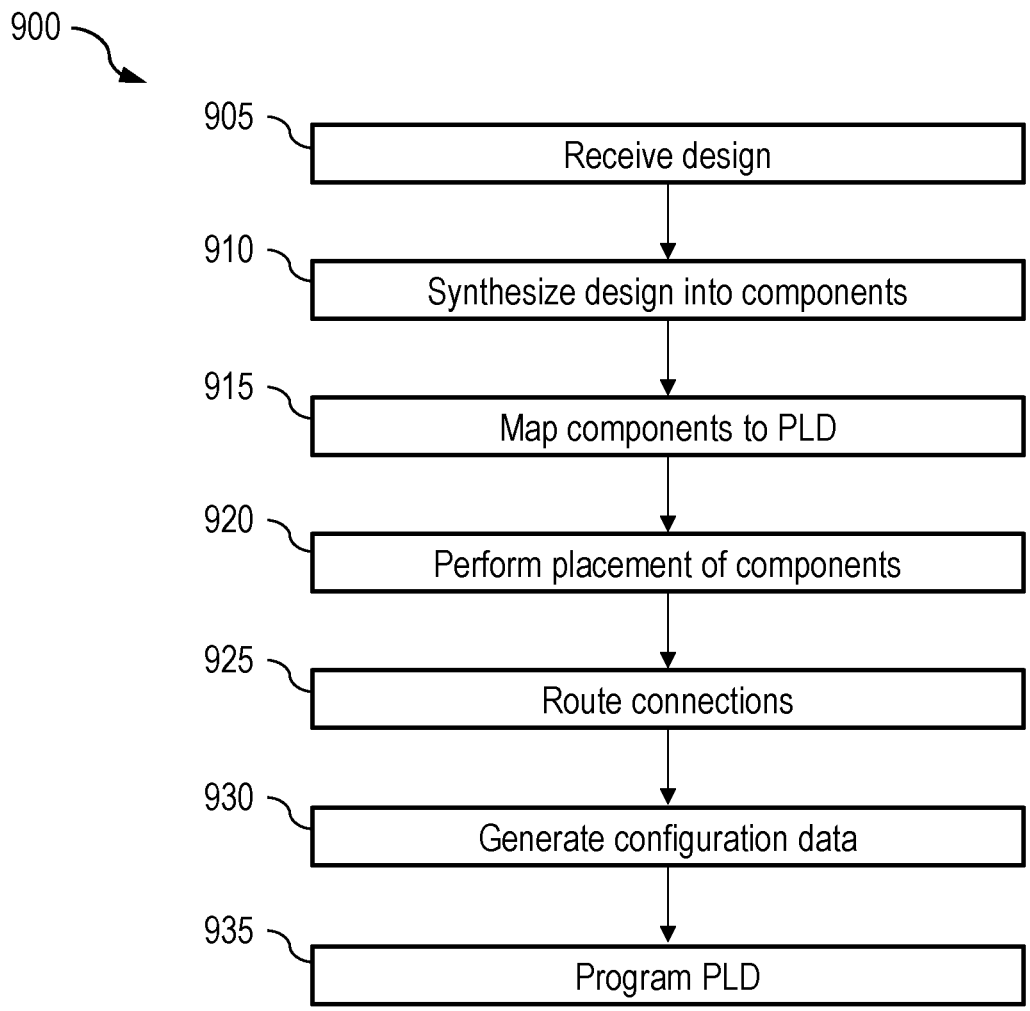
FIG. 9 illustrates a design process for a PLD in accordance with one or more embodiments of the disclosure.

FIG. 9 illustrates a design process 900 for a PLD in accordance with one or more embodiments of the disclosure. For example, the process of FIG. 9 may be performed by system 130 running Lattice Diamond software to configure the PLD 100. In some embodiments, the various files and information referenced in FIG. 9 may be stored, for example, in one or more databases and/or other data structures in the memory 134, the machine readable medium 136, and/or other storage. In some embodiments, the PLD 100 includes the LUT 500 and thus designing the PLD 100 includes designing the LUT 500.

In operation 905, the system 130 receives a user design that specifies the desired functionality of the PLD 100. For example, the user may interact with the system 130 (e.g., through the user input device 137 and hardware description language (HDL) code representing the design) to identify various features of the user design (e.g., high level logic operations, hardware configurations, I/O and/or SERDES operations, and/or other features). In some embodiments, the user design may be provided in an RTL description (e.g., a gate level description). The system 130 may perform one or more rule checks to confirm that the user design describes a valid configuration of PLD 100. For example, the system 130 may reject invalid configurations and/or request the user to provide new design information as appropriate.

In operation 910, the system 130 synthesizes the design to create a netlist (e.g., a synthesized RTL description) identifying an abstract logic implementation of the user design as a plurality of logic components (e.g., also referred to as netlist components). In some embodiments, the netlist may be stored in Electronic Design Interchange Format (EDIF) in a Native Generic Database (NGD) file.

In some embodiments, synthesizing the design into a netlist in operation 910 may involve converting (e.g., translating) the high-level description of logic operations, hardware configurations, and/or other features in the user design into a set of PLD components (e.g., logic blocks 104, logic cells 200, and other components of the PLD 100 configured for logic, arithmetic, or other hardware functions to implement the user design) and their associated interconnections or signals. Depending on embodiments, the converted user design may be represented as a netlist.

In some embodiments, synthesizing the design into a netlist in operation 910 may further involve performing an optimization process on the user design (e.g., the user design converted/translated into a set of PLD components and their associated interconnections or signals) to reduce propagation delays, consumption of PLD resources and routing resources, and/or otherwise optimize the performance of the PLD when configured to implement the user design. Depending on embodiments, the optimization process may be performed on a netlist representing the converted/translated user design. Depending on embodiments, the optimization process may represent the optimized user design in a netlist (e.g., to produce an optimized netlist).

In some embodiments, the optimization process may include optimizing routing connections identified in a user design. For example, the optimization process may include detecting connections with timing errors in the user design, and interchanging and/or adjusting PLD resources implementing the invalid connections and/or other connections to reduce the number of PLD components and/or routing resources used to implement the connections and/or to reduce the propagation delay associated with the connections. In some cases, wiring distances may be determined based on timing.

In operation 915, the system 130 performs a mapping process that identifies components of the PLD 100 that may be used to implement the user design. In this regard, the system 130 may map the optimized netlist (e.g., stored in operation 910 as a result of the optimization process) to various types of components provided by the PLD 100 (e.g., logic blocks 104, logic cells 200, embedded hardware, and/or other portions of the PLD 100) and their associated signals (e.g., in a logical fashion, but without yet specifying placement or routing). In some embodiments, the mapping may be performed on one or more previously-stored NGD files, with the mapping results stored as a physical design file (e.g., also referred to as an NCD file). In some embodiments, the mapping process may be performed as part of the synthesis process in operation 910 to produce a netlist that is mapped to PLD components.

In operation 920, the system 130 performs a placement process to assign the mapped netlist components to particular physical components residing at specific physical locations of the PLD 100 (e.g., assigned to particular logic cells 200, logic blocks 104, clock-related circuitry 108, routing resources 180, and/or other physical components of PLD 100), and thus determine a layout for the PLD 100. In some embodiments, the placement may be performed in memory on data retrieved from one or more previously-stored NCD files, for example, and/or on one or more previously-stored NCD files, with the placement results stored (e.g., in the memory 134 and/or the machine readable medium 136) as another physical design file.

In operation 925, the system 130 performs a routing process to route connections (e.g., using the routing resources 180) among the components of the PLD 100 based on the placement layout determined in operation 920 to realize the physical interconnections among the placed components. In some embodiments, the routing may be performed in memory on data retrieved from one or more previously-stored NCD files, for example, and/or on one or more previously-stored NCD files, with the routing results stored (e.g., in the memory 134 and/or the machine readable medium 136) as another physical design file.

In various embodiments, routing the connections in operation 925 may further involve performing an optimization process on the user design to reduce propagation delays, consumption of PLD resources and/or routing resources, and/or otherwise optimize the performance of the PLD when configured to implement the user design. The optimization process may in some embodiments be performed on a physical design file representing the converted/translated user design, and the optimization process may represent the optimized user design in the physical design file (e.g., to produce an optimized physical design file).

Changes in the routing may be propagated back to prior operations, such as synthesis, mapping, and/or placement, to further optimize various aspects of the user design.

Thus, following operation 925, one or more physical design files may be provided which specify the user design after it has been synthesized (e.g., converted and optimized), mapped, placed, and routed (e.g., further optimized) for the PLD 100 (e.g., by combining the results of the corresponding previous operations). In operation 930, the system 130 generates configuration data for the synthesized, mapped, placed, and routed user design.

In operation 940, the system 130 configures/programs the PLD 100 with the configuration data by, for example, loading a configuration data bitstream into the PLD 100 over the connection 140. In some embodiments, such loading of the configuration data bitstream into the PLD 100 programs functionality (e.g., components and associated routing) associated with the LUT 500.

As provided above, with reference back to FIG. 5, by the LUTs 505 and 510 having shared inputs (e.g., four shared A, B, C, and D in the example of FIG. 5) and at least one different input (e.g., EA for the LUT 505 and EB for the LUT 510), the LUT 500 provides flexibility in logic packed into the LUT 505 and LUT 610 while minimizing delay (e.g., by using as few multiplexers as needed). Providing the interconnections 540B and 565B for providing the signals EA and EB, respectively, as individually programmable interconnections provide more flexibility in functionality and packing. In this regard, the interconnections 540B and 565B are independent interconnections that may be separately/independently programmed. Such flexibility may facilitate implementation of the LUT 500 as one or more LUTs associated with six or fewer inputs. Thus, after operation 935, the LUT 500 may be programmed to implement packed logic according to those provided in FIGS. 6A, 6B, 6C, or other manners by which to pack logic for a desired application.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

In this regard, various embodiments of LUT structures described herein may be implemented with various types of hardware and/or software and allow for significant improvements in, for example, performance and space utilization. By way of non-limiting examples, LUT structures described herein may be implemented using ASICs, system on chips, general logic circuits, processors (e.g., configurable processors, digital signal processors), generally any programmable resources of any programmable circuit or device, or any combination thereof. As an example, various embodiments may be used in custom built RTL logic that can be implemented in a general integrated circuit and/or as its own type of dedicated block (e.g., as a standalone resource in a programmable fabric).

Software in accordance with the present disclosure, such as program code and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A look-up table (LUT) circuit comprising:
a first LUT configured to:
selectively receive a first input signal and each input signal of a set of input signals; and
determine a first output signal based on the first input signal and/or one or more input signals of the set of input signals; and
a second LUT configured to:
selectively receive a second input signal and each input signal of the set of input signals; and
determine a second output signal based on the second input signal and/or one or more input signals of the set of input signals;

a first multiplexer configured to:
  selectively receive the first output signal, the second output signal, and a third input signal; and
  selectively provide, based on the third input signal, the first output signal or the second output signal as a first LUT output signal of the LUT circuit; and
a plurality of programmable routing lines, wherein:
  the first LUT comprises a first plurality of input ports each configured to selectively connect to a respective one of the plurality of programmable routing lines;
  each input port of the first plurality of input ports is configured to selectively receive, via the programmable routing line selectively connected to the input port, the first input signal or a respective input signal of the set of input signals;
  the second LUT comprises a second plurality of input ports each configured to selectively connect to a respective one of the plurality of programmable routing lines; and
  each input port of the second plurality of input ports is configured to selectively receive, via the programmable routing line selectively connected to the input port, the second input signal or a respective input signal of the set of input signals.

2. The LUT circuit of claim 1, wherein the first LUT is configured to selectively provide the first output signal as a second LUT output signal of the LUT circuit, and wherein the second LUT is configured to selectively provide the second output signal as a third LUT output signal of the LUT circuit.

3. The LUT circuit of claim 1, wherein the set of input signals comprises a set of four input signals, wherein the first LUT is configured to implement a first five-input LUT configured to selectively receive the first input signal and each input signal of the set of four input signals, and wherein the second LUT is configured to implement a second five-input LUT configured to selectively receive the second input signal and each input signal of the set of four input signals.

4. The LUT circuit of claim 3, wherein:
the first five-input LUT is configured to implement:
  a first four-input LUT configured to:
    selectively receive each input signal of the set of input signals; and
    determine a third output signal based on one or more input signals of the set of input signals;
  a second four-input LUT configured to:
    selectively receive each input signal of the set of input signals; and
    determine a fourth output signal based on one or more input signals of the set of input signals; and
  a second multiplexer configured to:
    selectively receive the first input signal, the third output signal, and the fourth output signal; and
    selectively provide, based on the first input signal, the third output signal or the fourth output signal as the first output signal of the first LUT.

5. The LUT circuit of claim 4, wherein:
the second five-input LUT is configured to implement:
  a third four-input LUT configured to:
    selectively receive each input signal of the set of input signals; and
    determine a fifth output signal based on one or more input signals of the set of input signals;
  a fourth four-input LUT configured to:
    selectively receive each input signal of the set of input signals; and
    determine a sixth output signal based on one or more input signals of the set of input signals; and
  a third multiplexer configured to:
    selectively receive the second input signal, the fifth output signal, and the sixth output signal; and
    selectively provide, based on the second input signal, the fifth output signal or the sixth output signal as the second output signal of the second LUT.

6. The LUT circuit of claim 1, wherein the first LUT further comprises a second multiplexer associated with one of the first plurality of input ports and configured to:
  selectively connect to a respective one of the plurality of programmable routing lines via the one of the first plurality of input ports; and
  selectively receive the first input signal at the one of the first plurality of input ports via the respective one of the plurality of programmable routing lines.

7. The LUT circuit of claim 6, wherein the second LUT further comprises a third multiplexer associated with one of the second plurality of input ports and configured to:
  selectively connect to a respective one of the plurality of programmable routing lines via the one of the second plurality of input ports; and
  selectively receive the second input signal at the one of the second plurality of input ports via the respective one of the plurality of programmable routing lines.

8. The LUT circuit of claim 1, wherein:
the set of input signals comprises a fourth input signal;
the first LUT is configured to provide a two-input LUT configured to:
  selectively receive each of the first input signal and the fourth input signal via the respective programmable routing line;
  determine the first output signal based on the first input signal and the fourth input signal; and
  provide the first output signal as an output of the first LUT.

9. The LUT circuit of claim 8, wherein:
the set of input signals further comprises a fifth input signal, a sixth input signal, and a seventh input signal;
the second LUT is configured to provide a four-input LUT configured to:
  receive each of the second input signal, the fifth input signal, the sixth input signal, and the seventh input signal via the respective programmable routing line;
  determine the second output signal based on the second input signal, the fifth input signal, the sixth input signal, and the seventh input signal; and
  provide the second output signal as an output of the second LUT.

10. The LUT circuit of claim 1, wherein the first LUT and the second LUT are configured to collectively provide a six-input LUT configured to determine the first LUT output signal based on the first input signal, the third input signal, and the set of input signals.

11. A programmable logic device (PLD) comprising:
an array of configuration memory cells; and
a processing circuit configured to:
  receive configuration data associated with the PLD; and
  program the array of configuration memory cells with the configuration data to configure the LUT circuit of claim 1.

12. The PLD of claim 11, wherein:
the set of input signals comprises a fourth input signal and a fifth input signal;
the processing circuit is configured to program the array of configuration memory cells to connect the respective programmable routing lines to the respective input ports of the first plurality of input ports for receiving the first input signal, the fourth input signal, and the fifth input signal;

the first LUT is configured to provide a first three-input LUT configured to:
  receive each of the first input signal, the fourth input signal, and the fifth input signal via the respective programmable routing line;
  determine the first output signal based on the first input signal, the fourth input signal, and the fifth input signal; and
  provide the first output signal as an output of the first LUT.

13. The PLD of claim 12, wherein:
the set of input signals further comprises a sixth input signal and a seventh input signal;
the processing circuit is configured to program the array of configuration memory cells to further connect the respective programmable routing lines to the respective input ports of the second plurality of input ports for receiving the second input signal, the sixth input signal, and the seventh input signal;
the second LUT is configured to provide a second three-input LUT configured to:
  receive each of the second input signal, the sixth input signal, and the seventh input signal via the respective programmable routing line;
  determine the second output signal based on the second input signal, the sixth input signal, and the seventh input signal; and
  provide the second output signal as an output of the second LUT.

14. A method comprising:
receiving configuration data for a programmable logic device (PLD); and
programming an array of configuration memory cells of the PLD with the configuration data to program the LUT circuit of claim 1.

15. The method of claim 14, wherein the configuration data is provided from a remote system, a memory located within the PLD, and/or a separate memory of a system including the PLD and the separate memory.

16. A look-up table (LUT) method, the method comprising:
selectively connecting each of a plurality of programmable routing lines to a respective one of a first plurality of input ports of a first LUT or a respective one of a second plurality of input ports of a second LUT;
selectively receiving, by the first LUT, a first input signal and each input signal of a set of input signals, wherein each input port of the first plurality of input ports selectively receives, via the programmable routing line selectively connected to the input port, the first input signal or a respective input signal of the set of input signals;

determining, by the first LUT, a first output signal based on the first input signal and/or one or more input signals of the set of input signals;
selectively receiving, by a second LUT, a second input signal and each input signal of the set of input signals, wherein each input port of the second plurality of input ports selectively receives, via the programmable routing line selectively connected to the input port, the second input signal or a respective input signal of the set of input signals;
determining, by the second LUT, a second output signal based on the second input signal and/or one or more input signals of the set of input signals;
selectively receiving, by a first multiplexer, the first output signal, the second output signal, and a third input signal; and
selectively providing, by the first multiplexer based on the third input signal, the first output signal or the second output signal as a LUT output signal.

17. The method of claim 16, further comprising:
determining, by the first LUT, each of a third output signal and a fourth output signal based on one or more input signals of the set of input signals; and
selectively providing, by the first LUT, the third output signal or the fourth output signal as the first output signal based on the first input signal.

18. The method of claim 17, further comprising:
determining, by the second LUT, each of a fifth output signal and a sixth output signal based on one or more input signals of the set of input signals; and
selectively providing, by the second LUT, the fifth output signal or the sixth output signal as the second output signal based on the second input signal.

19. The method of claim 16, further comprising:
selectively connecting a second multiplexer associated with one of the first plurality of input ports to a respective one of the plurality of programmable routing lines via the one of the first plurality of input ports;
selectively receiving, by the second multiplexer, the first input signal at the one of the first plurality of input ports via the respective one of the plurality of programmable routing lines;
selectively connecting a third multiplexer associated with one of the second plurality of input ports to a respective one of the plurality of programmable routing lines via the one of the second plurality of input ports; and
selectively receiving, by the third multiplexer, the second input signal at the one of the second plurality of input ports via the respective one of the plurality of programmable routing lines.

20. The method of claim 16, wherein the first LUT and the second LUT are configured to collectively provide a six-input LUT configured to determine the first LUT output signal based on the first input signal, the third input signal, and the set of input signals.

* * * * *